(12) United States Patent
Yang et al.

(10) Patent No.: US 11,437,516 B2
(45) Date of Patent: Sep. 6, 2022

(54) MECHANISMS FOR GROWING EPITAXY STRUCTURE OF FINFET DEVICE

(71) Applicant: TAIWAN SEMICONDUCTOR MANUFACTURING CO., LTD., Hsinchu (TW)

(72) Inventors: Szu-Chi Yang, Hsinchu (TW); Chih-Hsiang Huang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/381,270

(22) Filed: Dec. 16, 2016

(65) Prior Publication Data

US 2018/0151737 A1    May 31, 2018

Related U.S. Application Data

(60) Provisional application No. 62/426,824, filed on Nov. 28, 2016.

(51) Int. Cl.
| | |
|---|---|
| *H01L 29/78* | (2006.01) |
| *H01L 21/8234* | (2006.01) |
| *H01L 21/8238* | (2006.01) |
| *H01L 29/66* | (2006.01) |
| *H01L 29/08* | (2006.01) |
| *H01L 29/165* | (2006.01) |

(52) U.S. Cl.
CPC .. *H01L 29/7851* (2013.01); *H01L 21/823431* (2013.01); *H01L 21/823821* (2013.01); *H01L 29/0847* (2013.01); *H01L 29/66795* (2013.01); *H01L 29/785* (2013.01); *H01L 29/7848* (2013.01); *H01L 29/165* (2013.01)

(58) Field of Classification Search
CPC ..... H01L 21/823431; H01L 21/823821; H01L 29/7848; H01L 29/785; H01L 29/66795
See application file for complete search history.

(56) References Cited

U.S. PATENT DOCUMENTS

| | | | |
|---|---|---|---|
| 7,667,271 B2 | 2/2010 | Yu et al. | |
| 8,362,575 B2 | 1/2013 | Kwok et al. | |
| 8,367,498 B2 | 2/2013 | Chang et al. | |
| 8,440,517 B2 | 5/2013 | Lin et al. | |
| 8,497,528 B2 | 7/2013 | Lee et al. | |
| 8,610,240 B2 | 12/2013 | Lee et al. | |
| 8,680,576 B2 | 3/2014 | Ching et al. | |
| 8,723,272 B2 | 5/2014 | Liu et al. | |
| 8,729,627 B2 | 5/2014 | Cheng et al. | |

(Continued)

*Primary Examiner* — Marcos D. Pizarro
*Assistant Examiner* — Antonio B Crite
(74) *Attorney, Agent, or Firm* — Birch, Stewart, Kolasch & Birch, LLP (57) ABSTRACT

A semiconductor structure includes a gate structure disposed over a substrate, and a plurality of source/drain features disposed on the substrate and interposed by the gate structure. Each of the source/drain features includes a first doped source/drain region extended away from the substrate, and a second doped source/drain region disposed on top and side surfaces of the first doped source/drain region, in which a phosphorus doping concentration of the first doped source/drain region is lower than a doping concentration of the second doped source/drain region.

20 Claims, 8 Drawing Sheets

(56) References Cited

U.S. PATENT DOCUMENTS

| | | | |
|---|---|---|---|
| 8,729,634 B2 | 5/2014 | Shen et al. | |
| 8,785,285 B2 | 7/2014 | Tsai et al. | |
| 8,796,759 B2* | 8/2014 | Perng | H01L 29/165 257/328 |
| 8,809,139 B2 | 8/2014 | Huang et al. | |
| 8,828,823 B2 | 9/2014 | Liu et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 9,196,479 B1* | 11/2015 | Cheng | H01L 27/1211 |
| 9,318,581 B1* | 4/2016 | Guo | H01L 29/7853 |
| 9,324,841 B2* | 4/2016 | Yu | H01L 29/66795 |
| 9,793,356 B2* | 10/2017 | Yoo | H01L 29/1608 |
| 2011/0068407 A1 | 3/2011 | Yeh et al. | |
| 2011/0074498 A1* | 3/2011 | Thompson | H01L 21/823412 327/543 |
| 2012/0012932 A1* | 1/2012 | Perng | H01L 29/165 257/347 |
| 2012/0091528 A1* | 4/2012 | Chang | H01L 29/66795 257/347 |
| 2013/0011983 A1 | 1/2013 | Tsai et al. | |
| 2014/0252412 A1 | 9/2014 | Tsai et al. | |
| 2014/0349458 A1* | 11/2014 | Wu | H01L 21/823418 438/296 |
| 2014/0367800 A1* | 12/2014 | Lee | H01L 21/823807 257/402 |
| 2015/0318397 A1* | 11/2015 | Zhu | H01L 21/823431 257/192 |
| 2015/0333075 A1* | 11/2015 | Yang | H01L 29/06 257/369 |
| 2016/0079367 A1* | 3/2016 | Yoo | H01L 29/1608 257/77 |
| 2016/0141423 A1* | 5/2016 | Diaz | H01L 29/66666 257/329 |
| 2016/0148936 A1* | 5/2016 | Xu | H01L 27/0924 257/369 |
| 2016/0211371 A1* | 7/2016 | Tsai | H01L 21/26506 |
| 2016/0233144 A1* | 8/2016 | Pae | H01L 29/36 |
| 2017/0054003 A1* | 2/2017 | Liao | H01L 21/823418 |
| 2017/0243791 A1* | 8/2017 | Jacob | H01L 29/267 |
| 2018/0108654 A1* | 4/2018 | Ontalus | H01L 29/0847 |

* cited by examiner

MECHANISMS FOR GROWING EPITAXY STRUCTURE OF FINFET DEVICE

RELATED APPLICATIONS

This application claims priority to U.S. Provisional Application Ser. No. 62/426,824, filed Nov. 28, 2016, which is herein incorporated by reference.

BACKGROUND

The semiconductor integrated circuit (IC) industry has experienced rapid growth. Over the course of this growth, functional density of the devices has generally increased while the device feature size or geometry has decreased. This scaling down process generally provides benefits by increasing production efficiency, lowering costs, and/or improving performance. Such scaling down has also increased the complexities of processing and manufacturing ICs and, for these advances to be realized similar developments in IC fabrication are needed.

Likewise, the demand for increased performance and shrinking geometry from ICs has brought the introduction of multi-gate devices. These multi-gate devices include multi-gate fin-type transistors, also referred to as finFET devices, so called because the channel is formed on a "fin" that extends from the substrate. FinFET devices may allow for shrinking the gate width of device while providing a gate on the sides and/or top of the fin including the channel region.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-6B show cross-sectional views of sequential processes of fabricating a transistor region, in accordance with some embodiments, wherein FIGS. 2A, 3A, 4A, 5A, and 6A are cross-sectional views taken along the cut plane A illustrated in FIG. 1A, and FIGS. 2B, 3B, 4B, 5B and 6B are cross-sectional views taken along the cut plane B illustrated in FIG. 1A.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as finFET devices. Such a device may include a p-type metal oxide semiconductor finFET device or an n-type metal oxide semiconductor finFET device. The finFET device may be a dual-gate device, tri-gate device, and/or other configuration. FinFET devices may be included in an IC such as a microprocessor, memory device, and/or other IC. One of ordinary skill may recognize other embodiments of semiconductor devices that may benefit from aspects of the present disclosure.

Figure 1A:
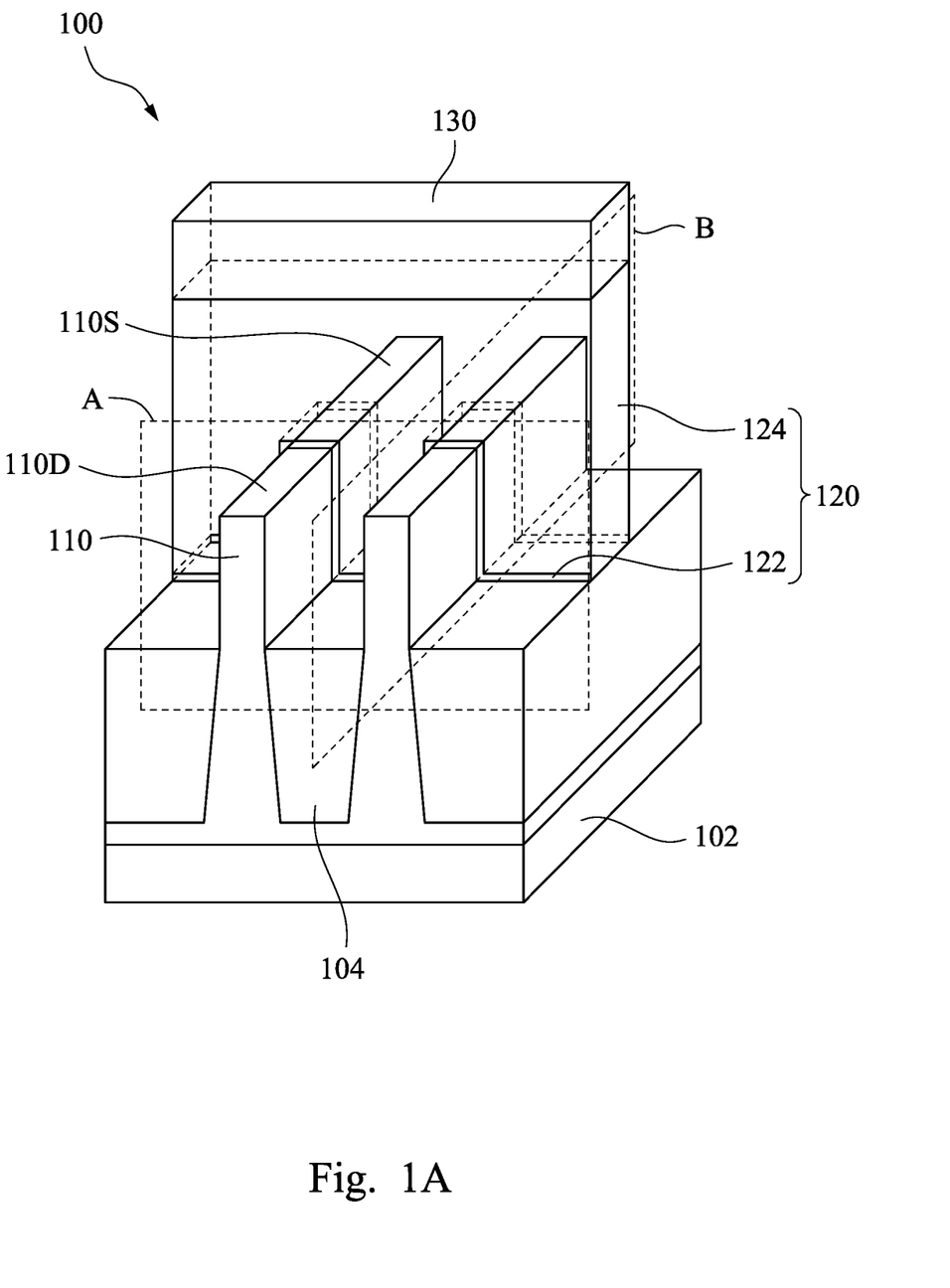
FIG. 1A is perspective view of a semiconductor structure, in accordance with some embodiments of the disclosure.

FIG. 1A is perspective view of a semiconductor structure 100, in accordance with some embodiments of the disclosure. The semiconductor structure 100 includes finFET type structures. The semiconductor structure 100 includes a substrate 102, a plurality of fins 110 extending from the substrate 102, and at least one gate structure 120 disposed crossing the fins 110. The gate structure 120 may include a gate dielectric layer 122, a gate electrode layer 124, and/or one or more additional layers. The perspective view of FIG. 1A is taken after the patterning (or forming) process of gate structure 120. Although FIG. 1A shows only one gate structure 120, there may be additional gate structure(s) (not shown) similar and parallel to the gate structure 120 shown in FIG. 1A.

The substrate 102 may be a silicon substrate. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, the substrate 102 is a semiconductor on insulator (SOI).

The fins 110 are formed extended away from the substrate 102. In some embodiments, the substrate 102 and the fins 110 are made of a same material, and the substrate 102 and the fins 110 are formed by selectively etching a thick substrate. For example, in the embodiments, the thick substrate is firstly provided, and portions of the thick substrate are removed to define the fins 110 protruding from the substrate 102. However, other techniques for fabricating the fins 110 are possible. In some embodiments, the portions of the thick substrate are removed by photolithography and etching process to form trenches, and thus to define the fins 110. Each of the fins 110 includes a source region 110S and a drain region 110D arranged at opposite sides of the gate structure 120, in which source or drain features are formed in, on, and/or surrounding the fin 110. A channel region of the fin 110 underlies the gate structure 120.

In some embodiments, the substrate 102 further includes isolation structures 104 arranged between the fins 110, such as shallow trench isolation (STI) structures. The isolation structure 104 is configured to separate the adjacent fins 110. In some embodiments, the isolation structures 104 are made of a dielectric material, such as silicon oxide, silicon nitride, silicon oxynitride, fluoride-doped silicate glass, a low-k dielectric material, any other suitable dielectric material or a combination thereof.

In some embodiment, the gate structure 120 can be a sacrificial gate structure such as formed in a replacement gate process used to form a metal gate structure, and the gate structure 120 may include polysilicon layer as the gate electrode layer 124. In some other embodiments, the gate structure 120 may be a metal gate structure. The metal gate structure may include interfacial layer(s), gate dielectric layer(s), work function layer(s), fill metal layer(s) and/or other suitable materials for a metal gate structure.

The gate dielectric layer 122 of the gate structure 120 may include silicon dioxide. The silicon oxide may be formed by suitable oxidation and/or deposition methods. Alternatively, the gate dielectric layer 122 of the gate structure 120 may include a high-k dielectric layer such as hafnium oxide ($HfO_2$). Alternatively, the high-k dielectric layer may optionally include other high-k dielectrics, such as $TiO_2$, $HfZrO$, $Ta_2O_3$, $HfSiO_4$, $ZrO_2$, $ZrSiO_2$, combinations thereof, or other suitable material. The high-k dielectric layer may be formed by atomic layer deposition (ALD) and/or other suitable methods.

Exemplary p-type work function metals that may be included in the gate structure 120 include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals that may be included in the gate structure 120 include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the first work function layer is chosen to tune its work function value so that a desired threshold voltage Vt is achieved in the device that is to be formed in the respective region. The work function layer(s) may be deposited by CVD, physical vapor deposition (PVD), and/or other suitable process. The fill metal layer may include Al, W, or Cu and/or other suitable materials. The fill metal may be formed by CVD, PVD, plating, and/or other suitable processes. The fill metal may be deposited over the work function metal layer(s), and thereby filling in the remaining portion of the trenches or openings formed by the removal of the dummy gate structure.

The semiconductor structure 100 described above includes fins 110 and gate structure 120. The semiconductor structure 100 needs additional processing to form various features, such as lightly doped drain (LDD) regions and doped source/drain regions, of the transistor utilizing semiconductor structure 100. LDD regions are next to channel regions and are under spacers. The term LDD regions are used to describe lightly doped regions next to both source/drain regions.

In some embodiments, a hard mask layer 130 is over the gate electrode layer 124. The hard mask layer 130 is used to pattern, such as by etching, the gate structure 120. In some embodiments, the hard mask layer 130 covers gate structures 120 and exposes surfaces of fins 110, such as drain regions 110D. The hard mask layer 130 is made of a dielectric material, such as silicon oxide, silicon oxynitride (SiON), or silicon nitride (SiN), in some embodiments. In some embodiments, the deposition process is a plasma-enhanced chemical vapor deposition (PECVD) process. Other applicable deposition process may also be used.

Figure 1B:
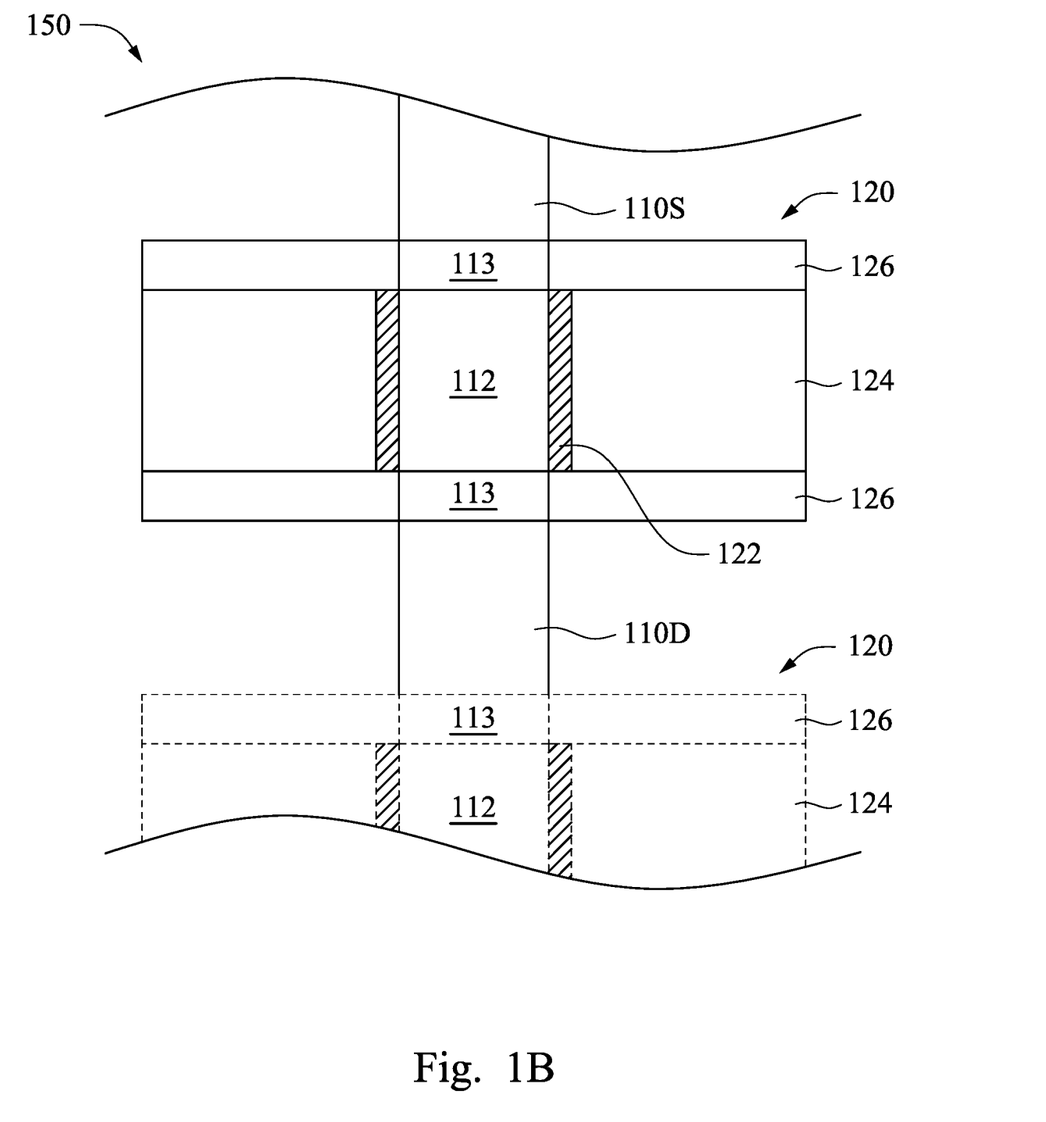
FIG. 1B is a top view of a transistor region formed with one of the fins of FIG. 1A in accordance with some embodiments.

FIG. 1B is a top view of a transistor region 150 formed with one of the fins 110 of FIG. 1A in accordance with some embodiments. Transistor region 150 includes a source region 110S and a drain region 110D. Transistor region 150 also includes a channel region 112, which is part of the fin 110 and is surrounded by the gate structure 120 on three sides, as shown in FIG. 1A. The transistor region 150 has features that are not shown in FIG. 1A, such as LDD region 113 and spacers 126. The LDD regions 113 are disposed between the source region 110S and the channel region 112, and between drain region 110D and channel region 112. FIG. 1B shows another gate structure 120 by dotted lines. This other gate structure 120 has been described above as being similar and parallel to the gate structure 120 and is not shown in FIG. 1A. The spacers 126 are formed on sidewalls of the gate structures 120.

FIGS. 2A-6B show cross-sectional views of sequential processes of fabricating a transistor region, in accordance with some embodiments. FIGS. 2A, 3A, 4A, 5A and 6A respectively are cross-sectional views of the transistor region according to the cut plane A illustrated in FIG. 1A, in accordance with some embodiments. FIGS. 2B, 3B, 4B, 5B and 6B respectively are cross-sectional views of the transistor region according to the cut plane B illustrated in FIG. 1A, in accordance with some embodiments. The processing sequence and structures described below are mainly for N-type finFET devices. However, at least portions of the embodiments described below may be applied for P-type finFET devices.

Figure 2A:
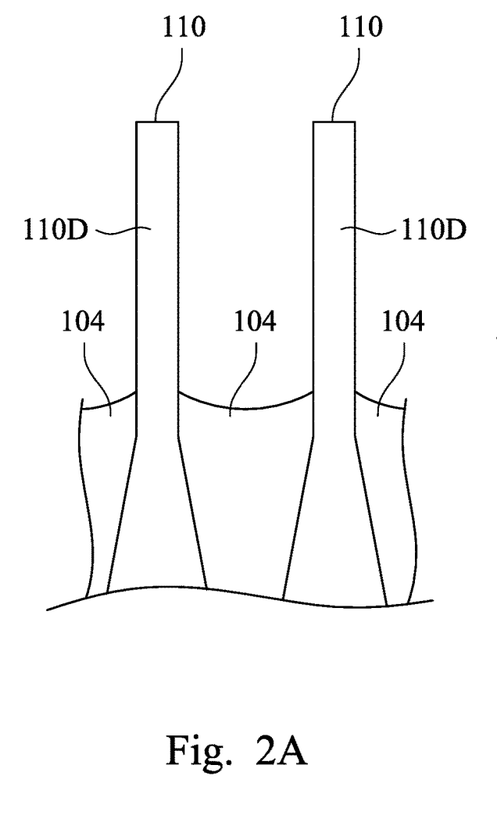
Figure 2B:
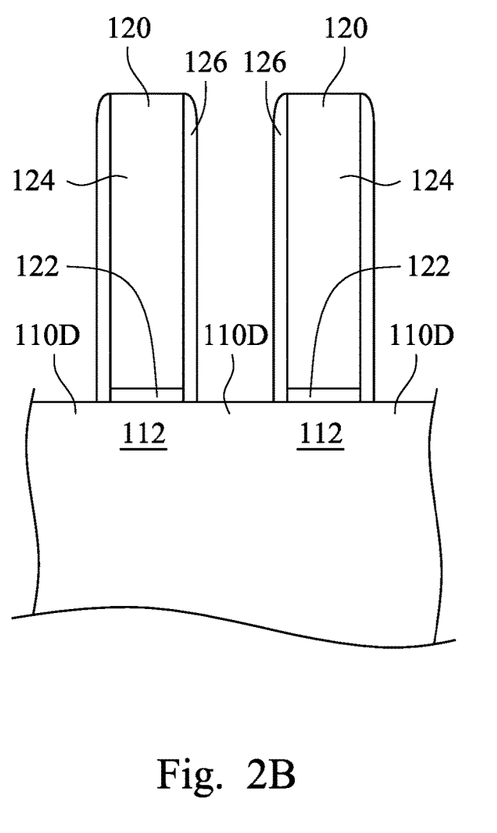

Reference is made to FIGS. 2A and 2B. FIG. 2A shows two neighboring fins 110 separated (or isolated) from each other by an isolation structure 104. Each of the two neighboring fins 110 has isolation structures 104 on both sides. Each fin 110 has a portion protruding above the neighboring isolation structures 104. The protruding portions of fins 110, for example, are drain regions 110D.

FIG. 2B shows two neighboring gate structures 120. As mentioned above, there may be additional gate structure(s) similar and parallel to the gate structure 120 shown in FIG. 1A. The two neighboring gate structures 120 in FIG. 2B are formed over one fin 110 and are separated by a source/drain region, such as the drain region 110D. Each gate structure 120 includes a gate electrode layer 124 and a gate dielectric layer 122. Channel regions 112 are between the source regions 110S (referring to FIG. 1A) and the drain regions 110D and are located direct under the gate structures 120.

Figure 3A:
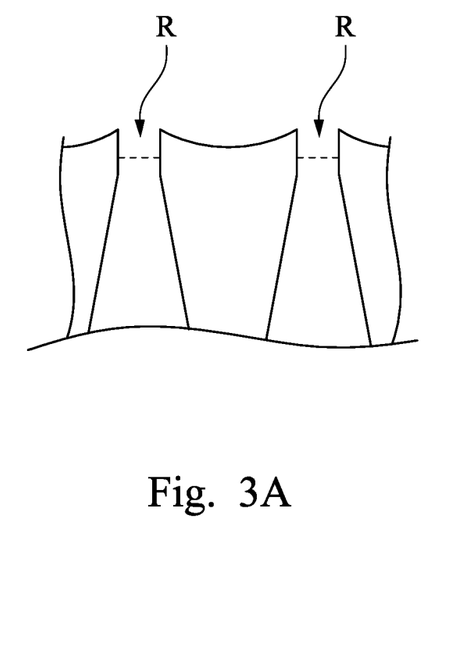
Figure 3B:
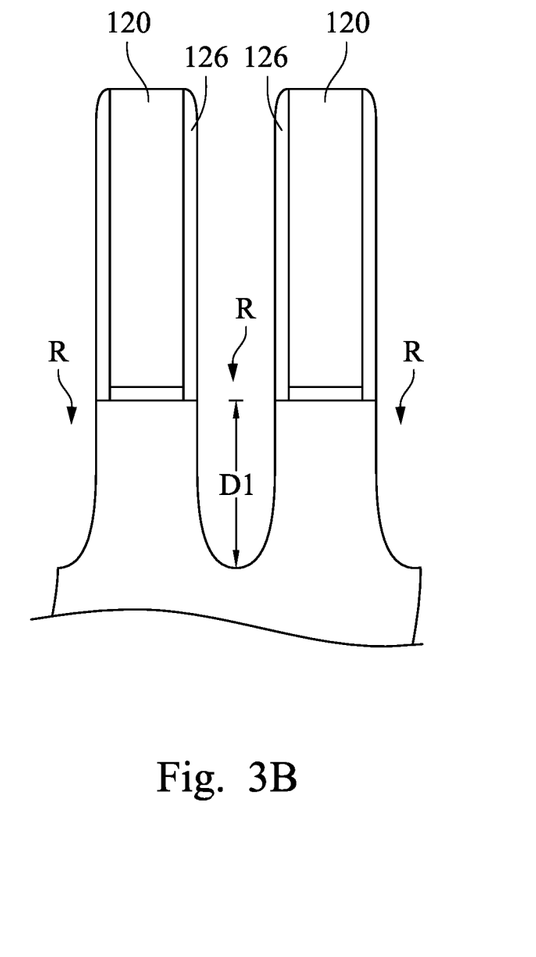

FIGS. 3A and 3B show cross-sectional views of FIGS. 2A and 2B after recesses are formed, in accordance with some embodiments. Prior to recessing the source/drain regions 110D and 110S (referring to FIG. 1A) of N-type devices, a photolithography process could be used to cover other regions, such as P-type device regions, on substrate, with photoresist to prevent etching. As a result, a resist removal process is needed after the etching process and before the next operation. Additional cleaning process could be used to ensure no residual resist remains on the substrate.

The source regions 110S (referring to FIG. 1A) and drain regions 110D are removed to form recesses R. In some embodiments, recesses R extend under a portion of spacers 126. The shapes (or outlines) of the recesses R shown in FIGS. 3A and 3B are merely exemplary. The recesses R may be formed to have either an angular or rounded shape on the bottoms. However, other shapes are also possible. Source regions 110S (referring to FIG. 1A) are also removed and recesses R are also formed in the source regions 110S. In some embodiments, the depth D1 of the recesses R is in a range from about 40 nm to 60 nm.

Figure 4A:
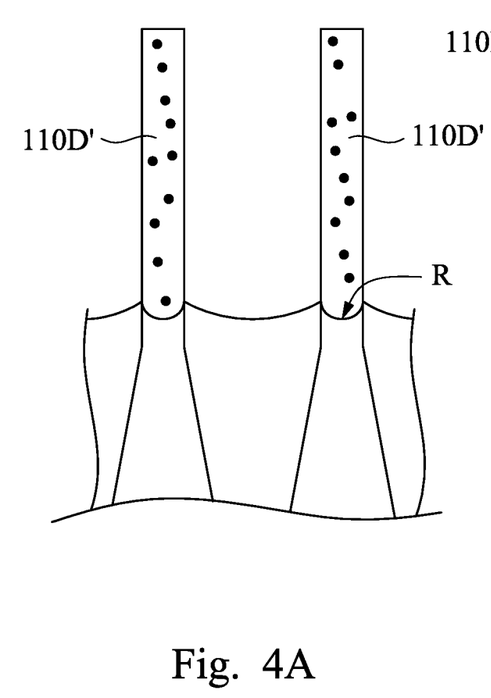
Figure 4B:
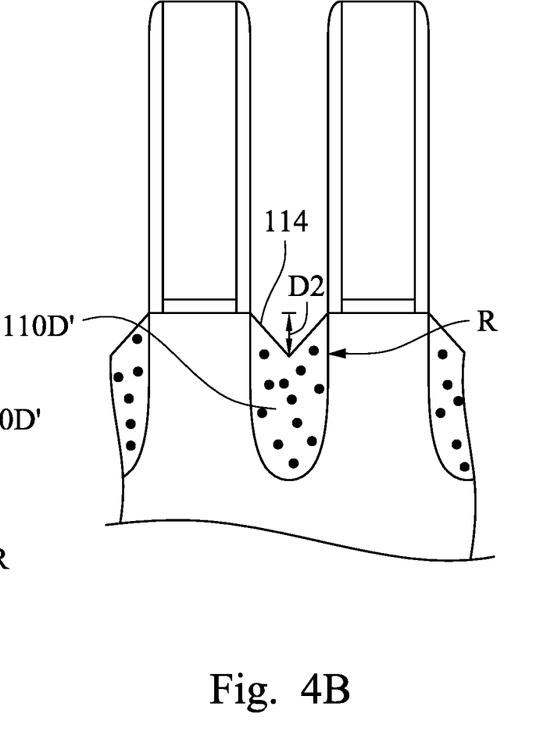

FIGS. 4A and 4B show cross-sectional views of FIGS. 3A and 3B after doped source/drain regions are formed, in accordance with some embodiments. After the recesses R are formed, an epitaxial material is deposited in recesses R to form first doped source regions and first doped drain regions (hereafter as first doped source/drain regions 110D' for simplicity) respectively. The first doped source/drain regions 110D' are located right next to the LDD regions 113, which are between channel regions 112 and the first doped source/drain regions 110D'. In some embodiments, the dopants in the first doped source/drain regions 110D' could diffuse into and dope the LDD regions 113 by anneal. In order to dope the LDD regions, the dopant concentration of the first doped source/drain regions 110D' needs to be higher than the required dopant concentration of the LDD regions. In some other embodiments, the LDD regions 113 can be formed by implantation, in which the dopant utilized in the implantation process can be the same or different from that utilized in forming the first doped source/drain regions 110D'. For example, dopants utilized in implanting the LDD regions 113 of the N-type finFET can be phosphorus (P) or arsenic (As).

In some embodiments, the epitaxial material filling recesses R to form the first doped source/drain regions 110D' is a silicon-containing material. In some embodiments, the silicon-containing material can be an n-type doped silicon layer that is doped with carbon (SiC). In some embodiments, the silicon-containing material can be an n-type doped silicon layer that is doped with both phosphorus and carbon (SiCP). Carbon could impede the out-diffusion of phosphorus from the silicon-containing material. Other types of dopants may also be included. The doping may be achieved by an ion implantation process, plasma immersion ion implantation (PIII) process, gas and/or solid source diffusion process, other suitable process, or combinations thereof. The silicon-containing material may further be exposed to annealing processes, such as a rapid thermal annealing (RTA) process.

In some embodiments, the epi growth of the epitaxially-grown silicon-containing material forms in-situ doped source/drain features with a lower lattice parameter than that of silicon thereby generating a tensile strain in the silicon channel. The deposition of the silicon-containing material includes in-situ doping the silicon-containing material, in accordance with some embodiments. By using the in-situ doping process, the dopant concentration (or level) of the silicon-containing material can be desirably controlled and achieved. In some other embodiments, the silicon-containing material can be grown by utilizing a selective epi growth (SEG) process. The precursors for the SEG process also include the precursor for in-situ phosphorous doping.

In some embodiments, the silicon-containing material can be formed by chemical vapor deposition (CVD), e.g., low pressure CVD (LPCVD), atomic layer CVD (ALCVD), ultrahigh vacuum CVD (UHVCVD), reduced pressure CVD (RPCVD), any suitable CVD; molecular beam epitaxy (MBE) processes; any suitable epitaxial process; or any combinations thereof. The deposition of the silicon-containing material can use at least one silicon-containing precursor, such as silane ($SiH_4$), disilane ($Si_2H_6$), trisilane ($Si_3H_8$), Dichlorosilane ($SiH_2Cl_2$), another silicon-containing precursor, and/or any combinations thereof. In other embodiments forming a p-type transistor, the silicon-containing material can be made of at least one material, such as silicon, silicon germanium, other semiconductor materials, and/or any combinations thereof.

As mentioned above, the deposition of the silicon-containing material includes in-situ doping the silicon-containing material, in accordance with some embodiments. For example, forming an n-type transistor can use an n-type doping precursor, e.g., phosphorous-containing gases such as phosphine ($PH_3$), arsenic-containing gases such as arsine ($AsH_3$), other n-type dopant-containing gases, or a combination thereof.

The silicon-containing material in recesses R is epitaxial. The deposition process forms a thin epitaxial layer of silicon-containing material in recesses R and an amorphous silicon-containing material on non-crystalline surfaces. An etching (or partial etching) process removes the amorphous silicon-containing material and also a portion of the silicon-containing material in recesses R. The etching process would remove the amorphous silicon-containing material over non-crystalline surface at a rate higher than the removal rate of epitaxial silicon-containing material. The remaining silicon-containing material fills in each of the recesses as the first doped source/drain regions 110D', and each of the first doped source/drain regions 110D' may have a concave top surface 114. Therefore, only epitaxial film remains on the substrate surface. The epitaxial deposition/partial etch process is repeated a number of times until a desired thickness is reached. In some embodiments, the depth D2 of the concave top surface 114 is in a range from about 0 nm to about 10 nm.

The scaling down device features results in tiny pitches between the adjacent first doped source/drain regions 110D'. Therefore, the shape or the width of the first doped source/drain regions 110D' needs to be controlled in order to prevent unwanted merge issue. In some embodiments, the first doped source/drain regions 110D' are not facet-growth epitaxy structures. That is, the first doped source/drain regions 110D' are epitaxially grown in the recesses R from bottom to top without too much lateral expansion.

In some embodiments, the first doped source/drain regions 110D' are epitaxially grown by a low phosphorus doping concentration epitaxy process. The low phosphorus doping concentration silicon-containing material is grown faster in the vertical direction than the high phosphorus doping concentration silicon-containing material. Therefore, the low phosphorus doping concentration silicon-containing material can be grown from bottom to top and fill the recesses R in a short period thereby forming the bar-shaped first doped source/drain regions 110D'. That is, the first doped source/drain regions 110D' is formed before the silicon-containing material begins to lateral expand, such that the width of the first doped source drain regions is substantially uniform from bottom to top.

In some embodiments, the low phosphorus doping concentration silicon-containing material can be an n-type doped silicon layer that is doped with carbon (SiC) or an n-type doped silicon layer that is doped with both phosphorus and carbon (SiCP). In some embodiments, the concentration of the carbon is in a range from about 1E21 at/$cm^3$ to about 5E21 at/$cm^3$. In some embodiments, the concentration of the phosphorus is in a range from about 1E20 at/cm3 to about 5E20 at/cm3. If the concentration of the low phosphorus doping concentration silicon-containing material is lower than the described range, junction overlap between source/drain and channel is not sufficient, which increases the channel resistance and degrades the device performance; if the concentration of the low phosphorus doping concentration silicon-containing material is higher than the described range, the unwanted lateral expansion issue would be raised.

Figure 5A:
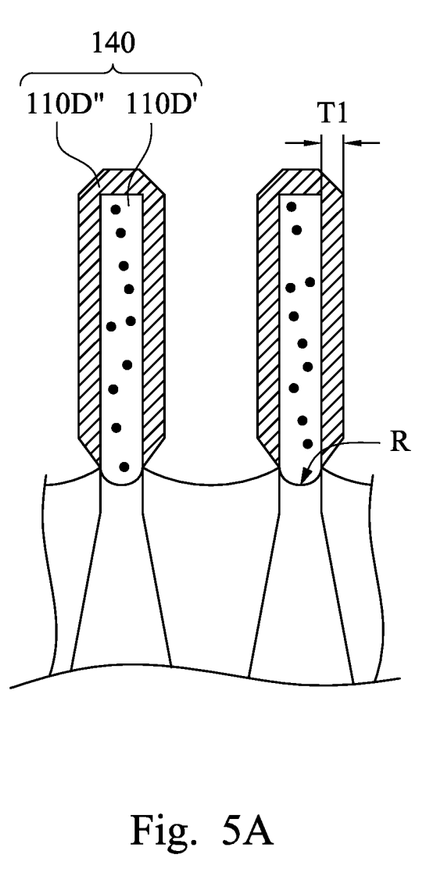
Figure 5B:
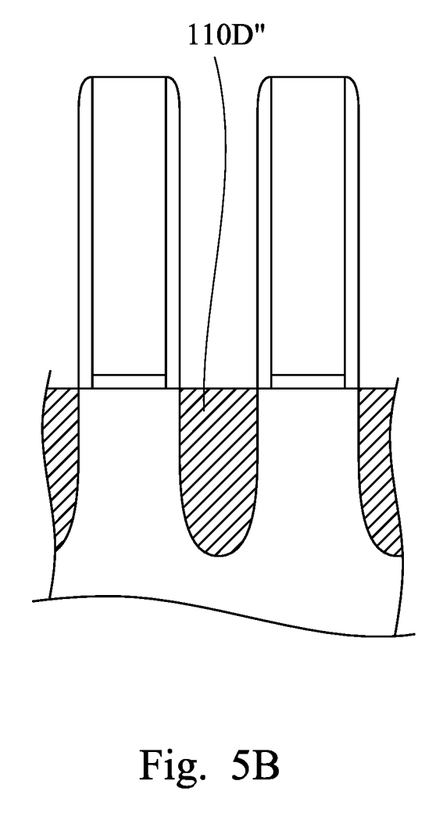

Reference is made to FIGS. 5A and 5B. After the low concentration silicon-containing material forms the first doped source/drain regions 110D', an additional layer of silicon-containing material with higher phosphorus doping concentration is deposited on the first doped source/drain regions 110D' thereby respectively forming a second doped source/drain regions 110D" on the top and side surfaces of the first doped source/drain regions 110D'. The composition of the second doped source/drain regions 110D" is different from the composition of the first doped source/drain regions 110D'. In some embodiments, the second doped source/drain regions 110D" can be an n-type doped silicon layer that is doped with phosphorus (SiP). The second doped source/drain regions 110D" have a phosphorus doping concentration higher than that of the first doped source/drain regions 110D'. For example, the concentration of the phosphorus of the second doped source/drain regions 110D" is in a range from about 3E21 at/cm$^3$ to about 6E21 at/cm$^3$. If the concentration of the phosphorus of the second doped source/drain regions 110D" is lower than the described range, junction overlap between source/drain and channel is not enough due to insufficient dopant concentration. If the concentration of the phosphorus of the second doped source/drain regions 110D" is higher than the described range, strong DIBL (drain-induced barrier lowing) effect, which contributes the leakage, may be raised.

The second doped source/drain regions 110D" are conformally formed on the first doped source/drain regions 110D'. The first doped source/drain regions 110D' and the second doped source/drain regions 110D" construct bar-shaped epitaxy structures as source/drain features 140 of the finFET devices. The thickness T1 of the second doped source/drain regions 110D" is uniform and is in a range from about 5 nm to about 10 nm. Since the first doped source/drain regions 110D' and the second doped source/drain regions 110D" construct the bar-shaped source/drain features 140, the adjacent bar-shaped source/drain features 140 may be isolated from each other, and the problem of merging adjacent epitaxy structures in N-type finFET devices can be prevented.

The first doped source/drain regions 110D' include carbon, which could retard phosphorus diffusion. The first doped source/drain regions 110D' are also regarded as stressors thereby improving short channel effect and allowing aggressive junction proximity push in N-type finFET devices. The first doped source/drain regions 110D' introduce stress of SiC or SiCP into the Si fin. Stressing the channel leads to higher channel electron mobility, and that in turn results in lowering of the channel resistance.

Figure 6A:
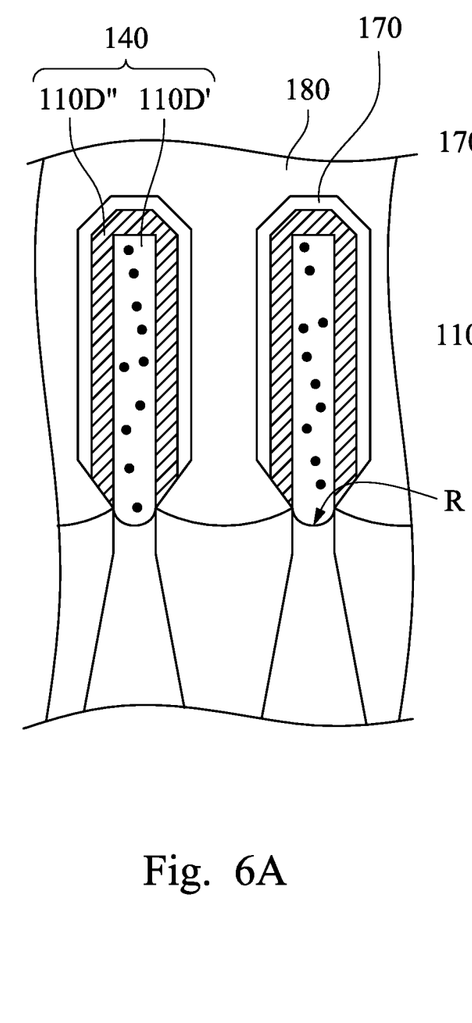
Figure 6B:
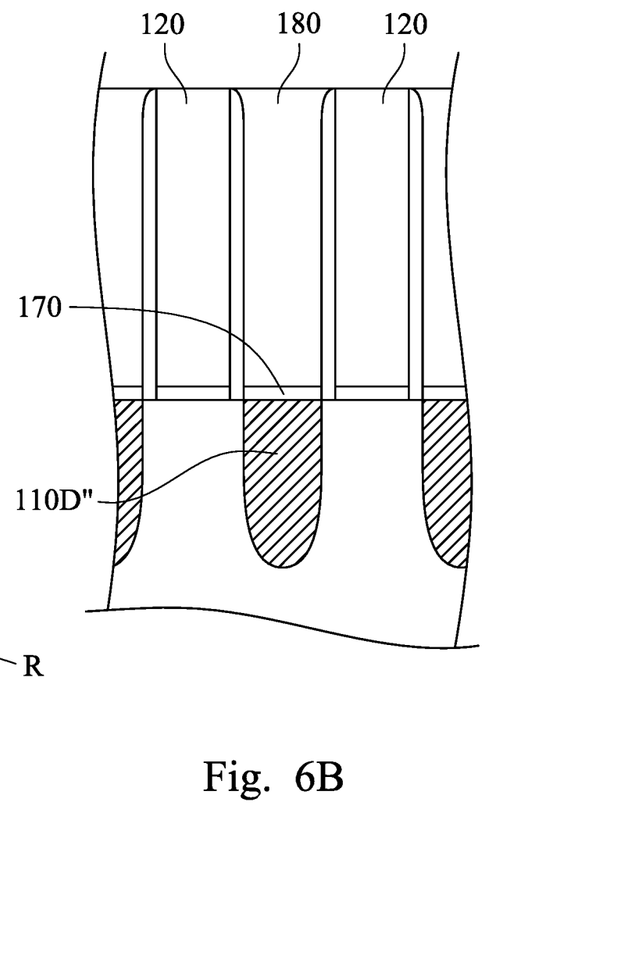

Reference is made to FIGS. 6A and 6B. After the bar-shaped source/drain features 140 are formed, a capping layer 170 is optionally formed on the bar-shaped source/drain features 140. The capping layer 170 is made of material having etching selectively from that of the second doped source/drain regions 110D". The capping layer 170 is utilized to protect the underlying bar-shaped source/drain features 140 in the following fabricating processes.

Additionally, an interlayer dielectric (ILD) layer 180 can be further formed on the substrate. The ILD layer 180 includes silicon oxide, low-k dielectric material or other proper dielectric material. The low-k dielectric material is a dielectric material with dielectric constant less than about 3.9, the dielectric constant of the thermal silicon oxide. The ILD layer 180 is deposited on the substrate and gate structure 120 by a suitable technique, such as CVD. For example, a high density plasma CVD may be implemented to form the ILD layer 180. In some embodiments, the ILD layer 180 is formed on the substrate to a level above the top surface of the gate structure 120. In some embodiments, a chemical mechanical polishing (CMP) process is further applied to the ILD layer 180 to planarize the top surface of the ILD layer 180. Other processing steps may be implemented before, during and/or after the formation of the semiconductor structure including the finFET device. For example, a multilayer interconnect (MLI) structure can be further formed on the substrate. The multilayer interconnect structure includes vertical interconnects, such as vias or contacts, and horizontal interconnects, such as metal lines. The various interconnect features may use various conductive materials including copper, tungsten and silicide. A plurality of contact features may be formed in the ILD layer 180 and are aligned with various contact regions of the source/drain features 140. The formation of the contact features may include etching to form contact holes and filling the contact holes with one or more metal, resulting in metal plugs as contact features.

Thereafter, various metal lines and via features may be formed on the ILD layer 180. The formation of the metal lines and via features may include damascene process (single or dual damascene process), such as those used to form copper interconnect structure. In some embodiments, tungsten is used to form tungsten plugs in the contact holes. The interconnect structure is configured to couple the various devices and circuit features to the input and output signals and power lines.

Figure 7:
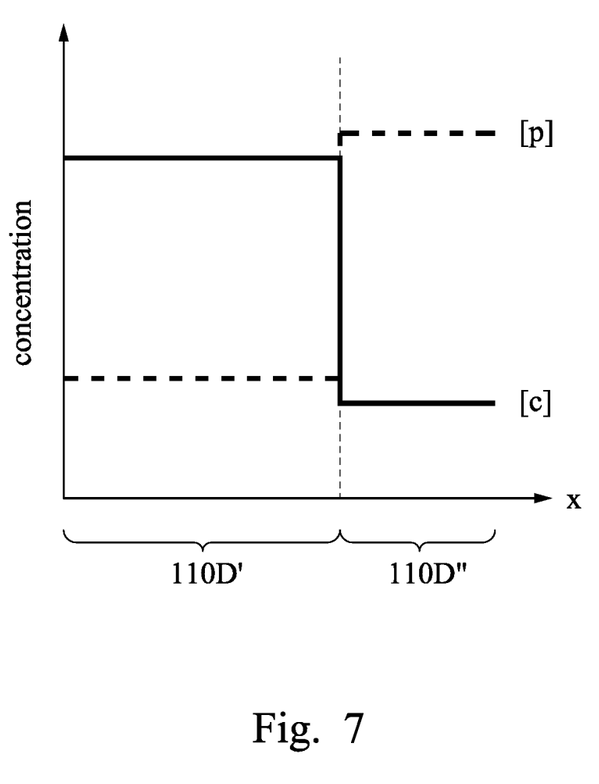
FIG. 7 is a doping concentration distribution diagram of taken along line 7-7 of the bar-shaped source/drain features in FIG. 6A.

Reference is made to FIGS. 6A and 7, in which FIG. 7 is a doping concentration distribution diagram of taken along direction x of the bar-shaped source/drain features in FIG. 6A. The bar-shaped source/drain feature 140 includes the first doped source/drain region 110D' and the second doped source drain region 110D", in which the first doped source/drain regions 110D' is a bar-shaped epitaxy structure, and the second doped source/drain region 110D" is an epitaxy layer conformally formed on the bar-shaped epitaxy structure. The first doped source/drain region 110D' and the second doped source/drain region 110D" respectively have uniform doping concentrations. The phosphorus doping concentration of the first doped source/drain region 110D' is lower than the phosphorus doping concentration of the second doped source/drain region 110D". For example, the phosphorus doping concentration of the first doped source/drain region 110D' is in a range from about 1E20 at/cm$^3$ to about 5E20 at/cm$^3$, and the phosphorus doping concentration of the second doped source/drain regions 110D" is in a range from about 3E21 at/cm$^3$ to about 6E21 at/cm$^3$. On the other hand, the first doped source/drain region 110D' includes carbon dopants to improve short channel effect, therefore, the carbon doping concentration of the first doped source/drain region 110D' is higher than the second doped source/drain region 110D".

According to some embodiments of the disclosure, a semiconductor structure includes a gate structure disposed over a substrate, and a plurality of source/drain features disposed on the substrate and interposed by the gate structure. Each of the source/drain features includes a first doped source/drain region extended away from the substrate, and a second doped source/drain region disposed on top and side surfaces of the first doped source/drain region, in which a phosphorus doping concentration of the first doped source/ drain region is lower than a doping concentration of the second doped source/drain region.

According to some embodiments of the disclosure, a semiconductor structure includes a substrate, a gate structure disposed over the substrate, a bar-shaped epitaxy structure formed on a recess adjacent to the gate structure, and an epitaxy layer disposed on top and side surfaces of the bar-shaped epitaxy structure, in which a composition of the epitaxy layer is different from a composition of the bar-shaped epitaxy structure.

According to some embodiments of the disclosure, a method of fabricating a semiconductor structure includes forming a gate structure over a substrate, forming a recess adjacent the gate structure in the substrate, epitaxially growing an epitaxy structure on the recess, and epitaxially growing an epitaxy layer on the epitaxy structure, in which a phosphorus doping concentration of the epitaxy structure is lower than a phosphorus doping concentration of the epitaxy layer.

Although the doping mechanisms described above are for N-type finFET devices. Similar doping mechanisms may be applied to P-type finFET devices with necessary modification of process flow and dopant type. It is understood that additional steps can be provided before, during, and/or after the method, and some of the steps described above can be replaced or eliminated, for additional embodiments of the disclosure. It is further understood that additional features can be added in the semiconductor structure 100, and some of the features described above can be replaced or eliminated, for additional embodiments of the semiconductor structure 100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a gate structure protruding from a substrate in a z direction and having a length in a y direction transverse to the z direction and a width in an x direction transverse to the z and y directions; and
   a plurality of source/drain features disposed on the substrate, spaced apart from each other in the x direction, and interposed by the gate structure, wherein each of the source/drain features comprises:
   an epitaxially grown first doped source/drain region epitaxially grown on the substrate in the z direction, wherein the epitaxially grown first doped source/drain region has a bar-shaped cross-section taken along the y direction and has a convex bottom surface in contact with the substrate;
   an epitaxially grown second doped source/drain region disposed on top and side surfaces of the epitaxially grown first doped source/drain region, wherein the epitaxially grown second doped source/drain region is made of SiP, when viewed in a cross section taken along the y direction, the epitaxially grown second doped source/drain region has a first upper slanting surface, a first lower slanting surface, and a substantially vertical sidewall interconnecting the first upper slanting surface and the first lower slanting surface, and a phosphorus doping concentration of the epitaxially grown first doped source/drain region is substantially uniform and is lower than a phosphorus doping concentration of the epitaxially grown second doped source/drain region; and
   a capping layer extending along the sidewall of the epitaxially grown second doped source/drain region, wherein at least a portion of the first lower slanting surface of the epitaxially grown second doped source/drain region is free from coverage by the capping layer,
   wherein when viewed in the cross section taken along the y direction,
   a top end of the first lower slanting surface of the epitaxially grown second doped source/drain region is connected to the sidewall of the epitaxially grown second doped source/drain region;
   the capping layer has a second lower slanting surface and a substantially vertical sidewall, a bottom end of the substantially vertical sidewall of the capping layer is connected to a top end of the second lower slanting surface of the capping layer; and
   a bottom end of the second lower slanting surface of the capping layer is connected to the top end of the first lower slanting surface of the epitaxially grown second doped source/drain region, the bottom end of the second lower slanting surface of the capping layer is free of contact with a remainder of the first lower slanting surface of the epitaxially grown second doped source/drain region, and higher than the bottom end of the first lower slanting surface of the epitaxially grown second doped source/drain region.

2. The semiconductor structure of claim 1, wherein the capping layer is made of a material having an etching selectivity from the epitaxially grown second doped source/drain region.

3. The semiconductor structure of claim 1, wherein when viewed in the cross section taken along the y direction, a topmost surface of the epitaxially grown second doped source/drain region is substantially flat.

4. The semiconductor structure of claim 1, wherein the source/drain features are completely spaced apart from each other in the y direction.

5. The semiconductor structure of claim 1, wherein the source/drain features has first and second source/drain features adjacent to each other in the y direction, and the capping layers of the first and second source/drain features are completely spaced apart from each other.

6. The semiconductor structure of claim 1, wherein the epitaxially grown second doped source/drain region is directly in contact with the top and side surfaces of the epitaxially grown first doped source/drain region.

7. The semiconductor structure of claim 1, wherein a bottom of the capping layer is higher than a bottom of the epitaxially grown second doped source/drain region.

8. The semiconductor structure of claim 1, wherein the first lower slanting surface of the epitaxially grown second doped source/drain region has a same slope as the second lower slanting surface of the capping layer.

9. A semiconductor structure, comprising:
   a substrate;
   a gate structure protruding from the substrate in a z direction and having a length in a y direction transverse to the z direction and a width in an x direction transverse to the z and y directions;

a bar-shaped epitaxy structure formed adjacent to the gate structure, grown epitaxially on the substrate in the z direction, and having a bar-shaped cross-section taken along the y direction, wherein the bar-shaped epitaxy structure comprises carbon and phosphorus dopants, a phosphorus atomic concentration of the bar-shaped epitaxy structure is lower than a carbon atomic concentration of the bar-shaped epitaxy structure, and the phosphorus atomic concentration of the bar-shaped epitaxy structure is in a range from about $1 \times 10^{20}$ at/cm$^3$ to about $5 \times 10^{20}$ at/cm$^3$;

an epitaxy layer substantially uniformly disposed on top and side surfaces of the bar-shaped epitaxy structure, wherein the epitaxy layer is made of SiP and is free of carbon, and a composition of the epitaxy layer is different from a composition of the bar-shaped epitaxy structure, when viewed in a cross section taken along the y direction, the epitaxial layer has a first upper slanting surface, a first lower slanting surface, and a substantially vertical sidewall interconnecting the first upper slanting surface and the first lower slanting surface; and a capping layer extending along a sidewall of the epitaxial layer, wherein at least a portion of the first lower slanting surface of the epitaxial layer is free from coverage by the capping layer, wherein when viewed in the cross section taken along the y direction, a top end of the first lower slanting surface of the epitaxy layer is connected to the sidewall of the epitaxy layer;

the capping layer has a second lower slanting surface and a substantially vertical sidewall, a bottom end of the substantially vertical sidewall of the capping layer is connected to a top end of the second lower slanting surface of the capping layer; and a bottom end of the second lower slanting surface of the capping layer is connected to the top end of the first lower slanting surface of the epitaxy layer, the bottom end of the second lower slanting surface of the capping layer is free of contact with a remainder of the first lower slanting surface of the epitaxy layer, and higher than the bottom end of the first lower slanting surface of the epitaxial layer.

10. The semiconductor structure of claim 9, wherein the phosphorus atomic concentration of the bar-shaped epitaxy structure is lower than a phosphorus atomic concentration of the epitaxy layer.

11. The semiconductor structure of claim 9, wherein a portion of the epitaxy layer has a uniform thickness.

12. The semiconductor structure of claim 9, wherein the bar-shaped epitaxy structure has a uniform width.

13. The semiconductor structure of claim 9, further comprising:
a second bar-shaped epitaxy structure; and
a second epitaxy layer disposed on top and side surfaces of the second bar-shaped epitaxy structure, wherein epitaxy layer and the second epitaxy layer are disposed on the same side of the gate structure and are spaced apart from each other.

14. The semiconductor structure of claim 9, wherein the second lower slanting surface of the capping layer is aligned with the first lower slanting surface of the epitaxial layer.

15. A method of fabricating a semiconductor structure, comprising:
etching a fin in a substrate, wherein the fin and the substrate are defined by a single piece of semiconductive material that is continuous throughout, and the fin protrudes from the substrate in a z direction and has a length in a y direction transverse to the z direction and a width in an x direction transverse to the z and y directions;
forming an isolation structure around a lower portion of the fin;
forming a gate structure over a first portion of the fin, wherein a second portion of the fin is free from coverage by the gate structure;
after forming the gate structure, etching the second portion of the fin such that a top of the second portion of the fin is lower than a top of the isolation structure, and a top of the first portion of the fin is higher than the top of the isolation structure after etching the second portion of the fin;
after etching the second portion of the fin, epitaxially growing an epitaxy structure by a phosphorous doping concentration epitaxy process directly on the second portion of the fin in the z direction such that the epitaxy structure has a bar-shaped cross-section taken along the x direction, wherein epitaxially growing the epitaxy structure is performed such that the epitaxy structure comprises carbon and phosphorus dopants, and a phosphorus atomic concentration of the epitaxy structure is lower than a carbon atomic concentration of the epitaxy structure; and
epitaxially and substantially uniformly growing an epitaxy layer directly on the epitaxy structure, wherein a phosphorus doping concentration of the epitaxy layer is in a range from about $3 \times 10^{21}$ at/cm$^3$ to about $6 \times 10^{21}$ at/cm$^3$.

16. The method of claim 15, wherein the epitaxy layer is substantially uniformly formed on top and side surfaces of the epitaxy structure.

17. The method of claim 15, wherein the epitaxy structure is made of SiCP, and the epitaxy layer is made of SiP.

18. The method of claim 15, wherein the fin comprises an N-type dopant.

19. The method of claim 15, further comprising annealing the epitaxy structure such that an N-type dopant of the epitaxy structure is diffused to form a lightly doped drain adjacent the epitaxy structure.

20. The method of claim 15, wherein a lattice constant of the epitaxy structure is smaller than a lattice constant of the fin.

* * * * *